United States Patent
Fujino

(10) Patent No.: US 8,023,209 B2
(45) Date of Patent: Sep. 20, 2011

(54) METHOD OF MANUFACTURING LIGHT SOURCE DEVICE AND THE LIGHT SOURCE DEVICE

(75) Inventor: Hitoshi Fujino, Kasugai (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 1042 days.

(21) Appl. No.: 11/843,355

(22) Filed: Aug. 22, 2007

(65) Prior Publication Data

US 2008/0049807 A1 Feb. 28, 2008

(30) Foreign Application Priority Data

Aug. 23, 2006 (JP) ................................. 2006-227133

(51) Int. Cl.
G02B 7/02 (2006.01)
G02B 27/10 (2006.01)
(52) U.S. Cl. ........................................ 359/819; 359/618
(58) Field of Classification Search .......... 359/694–700, 359/811–824, 618
See application file for complete search history.

(56) References Cited

U.S. PATENT DOCUMENTS

| | | | | |
|---|---|---|---|---|
| 4,878,066 A | * | 10/1989 | Shiraishi | 347/235 |
| 4,907,017 A | * | 3/1990 | Azuma | 347/242 |
| 4,962,983 A | * | 10/1990 | Watanabe | 359/205.1 |
| 5,470,892 A | * | 11/1995 | Gupta et al. | 522/42 |
| 5,999,345 A | * | 12/1999 | Nakajima et al. | 359/821 |
| 6,181,363 B1 | | 1/2001 | Satoh | |
| 7,141,517 B2 | * | 11/2006 | Kawaguchi et al. | 438/795 |
| 7,295,225 B2 | | 11/2007 | Ohsugi | |
| 7,837,361 B2 | * | 11/2010 | Santoro et al. | 362/355 |
| 2008/0050151 A1 | * | 2/2008 | Kato et al. | 399/221 |

FOREIGN PATENT DOCUMENTS

| | | |
|---|---|---|
| JP | 63-172204 A | 7/1988 |
| JP | 5-163037 A | 6/1993 |
| JP | 6-164829 | 6/1994 |
| JP | 9-218368 | 8/1997 |
| JP | 11-095078 A | 4/1999 |
| JP | 11-160640 | 6/1999 |
| JP | 11-231237 | 8/1999 |
| JP | 11-281904 | 10/1999 |

(Continued)

OTHER PUBLICATIONS

U.S. Official Action dated Jun. 9, 2010.
U.S. Official Action dated Nov. 27, 2009.
U.S. Office Action dated Sep. 16, 2010.
U.S. Office Action dated Mar. 18, 2011 from related U.S. Appl. No. 11/843,308.

(Continued)

*Primary Examiner* — Mohammed Hasan
(74) *Attorney, Agent, or Firm* — Scully, Scott, Murphy & Presser, PC

(57) ABSTRACT

A method of manufacturing a light source device includes: preparing a holder for a semiconductor laser and a coupling lens having a first side confronting the semiconductor laser and a second side opposite to the first side, a photopolymerizable resin being provided on the holder at least at a location between the coupling lens and the holder; locating a light source for emitting a curing light for curing the photopolymerizable resin on an opposite side of the semiconductor laser with respect to the coupling lens, a reflecting member being provided on an opposite side of the light source with respect to the coupling lens; and curing the photopolymerizable resin by irradiating the curing light from the light source directly on a part of the photopolymerizable resin, and also on another remaining part of the photopolymerizable resin by reflecting the curing light on the reflecting member irradiating the curing light.

22 Claims, 9 Drawing Sheets

FOREIGN PATENT DOCUMENTS

| | | |
|---|---|---|
| JP | 2002-31773 | 1/2002 |
| JP | 2002-277791 | 9/2002 |
| JP | 2003-186375 A | 7/2003 |
| JP | 2004-47573 | 2/2004 |
| JP | 2004-158586 | 6/2004 |
| JP | 2004-158784 | 6/2004 |
| JP | 2006-184778 A | 7/2006 |
| JP | 2006-349839 | 12/2006 |
| JP | 2008-51978 A | 3/2008 |

OTHER PUBLICATIONS

Japanese Office Action dated May 11, 2011 in Japanese Patent Application No. 2006-227133 together with English language translation.

Japanese Office Action dated May 10, 2011 in Japanese Patent Application No. 2006-227133 together with English language translation.

* cited by examiner

METHOD OF MANUFACTURING LIGHT SOURCE DEVICE AND THE LIGHT SOURCE DEVICE

CROSS REFERENCE TO RELATED APPLICATION

This application claims priority from Japanese Patent Application No. 2006-227133 filed Aug. 23, 2006. The entire content of this priority application is incorporated herein by reference.

TECHNICAL FIELD

The present invention relates to a light source device and a manufacturing method thereof, as well as an exposure device and an image forming device using the light source device.

BACKGROUND

In an image forming device such as a laser printer and a digital copier, a laser beam scans a photosensitive body in correspondence with data of an image to be printed. Thereby an electrostatic latent image is formed on the photosensitive body. Then, the image forming device forms an image by supplying developer to the electrostatic latent image, transferring the image to a recording sheet and fixing the image on the sheet.

The image forming device is required to be downsized and low-priced in recent years. In accordance therewith, a light source device that irradiates the laser beam for forming the electrostatic latent image is also required to have a small size and a simple structure, while high accuracy in a product is also required.

The light source device includes a semiconductor laser and a coupling lens (or also called a collimating lens) that gathers the laser light emitted from the semiconductor laser and converts the laser light to a light flux. These two members are positioned with their optical axes being aligned with each other with high accuracy.

Japanese Patent Application Laid-Open Publication No. Hei-11-231237 (which will be referred to as Document 1 hereinafter) discloses, in its FIG. 1, a light source device in which a laser holder that holds a semiconductor laser and a lens holder that holds a coupling lens are prepared separately. The semiconductor laser and the coupling lens are fixed on the respective holders, and the holders are fixed after being positioned corresponding to each other. The lens holder is formed in a cylindrical shape so as to surround the whole circumference of the lens.

Japanese Patent Application Laid-Open Publication No. 2002-31773 (which will be referred to as Document 2 hereinafter) discloses, in its FIG. 2, another light source device that has a more simplified configuration in comparison with the configuration described above. The light source device described in Document 2 uses a holder (holding member) that is formed by integrating a part (main part) for holding the semiconductor laser and a part for holding the coupling lens. The part for holding the coupling lens is in a base shape that protrudes from the main part of the holder in front thereof. After the semiconductor laser is fixed on the holder, the coupling lens is fixed with photopolymerizable or light-curing resin on the base portion of the holder in front of the semi-conductor laser. It is noted that the photopolymerizable resin is provided not only between the coupling lens and the base, but also a part of the photopolymerizable resin protrudes outside from between the coupling lens and the base both on the front and rear sides of the coupling lens. Japanese Patent Application Laid-Open Publication No. Hei-9-218368 (which will be referred to as Document 3 hereinafter) discloses, in its FIG. 1, a case where the photopolymerizable resin is provided only between the coupling lens and the base.

SUMMARY

When the coupling lens is relatively thick, the lens can be sufficiently fixed by a method in which the photopolymerizable resin is provided only between the coupling lens and the holder as proposed in Document 3.

In addition, when the coupling lens is relatively thin, the lens can be fixed firmly by bonding the lens with the base not only at an outer peripheral surface of the lens, but also at the front and rear surfaces of the lens in a manner that a part of the photopolymerizable resin protrudes out from between the peripheral surface of the lens and the holder to the front and rear sides of the lens. It is noted that the front surface of the lens is defined as the surface of the lens from which the laser light exits, while the rear surface of the lens is defined as the other surface of the lens into which the laser light enters.

When the coupling lens is fixed on the base-shaped part of the holder as described in Document 2, the lens needs to be held in air by a robot hand with respect to the base. Therefore, irradiating an a curing light, such as an ultraviolet ray, for curing the photopolymerizable resin from directly above the coupling lens is difficult. However, if the ultraviolet ray is irradiated from the front (a side where the laser light exits) of the coupling lens, the ultraviolet ray does not strike on the part of the photopolymerizable resin that protrudes to the rear side of the coupling lens due to refraction of the light at the lens. For this reason, there is a problem that the photopolymerizable resin is not cured, or a large amount of time is required for the curing.

In such a case where the photopolymerizable resin cannot be cured evenly at a time, there is a possibility that the coupling lens moves due to contraction of the photopolymerizable resin while the photopolymerizable resin cures. Thereby, accuracy of the light source device may be lowered.

In view of the above, an object of the present invention is to provide a light source device with simple structure and high accuracy and a manufacturing method thereof, and an exposure device and an image forming device that employ the light source device.

In order to attain the above and other objects, the invention provides a method of manufacturing a light source device that includes a semiconductor laser, a coupling lens that converts laser light from the semiconductor laser to a light flux and that has a first side and a second side opposite to the first side, a holder that holds the semiconductor laser and the coupling lens in a manner that the first side of the coupling lens confronts the semiconductor laser, and a photopolymerizable resin that fixes the coupling lens on the holder. The method includes: preparing a holder, on which a semiconductor laser and a coupling lens are provided, the coupling lens having a first side and a second side opposite to the first side, the first side confronting the semiconductor laser, a photopolymerizable resin being provided on the holder at least at a location between the coupling lens and the holder; locating a light source for emitting a curing light for curing the photopolymerizable resin on an opposite side of the semiconductor laser with respect to the coupling lens, a reflecting member being provided on an opposite side of the light source with respect to the coupling lens; and curing the photopolymerizable resin by directly irradiating the curing light from the light source on a part of the photopolymerizable resin, and also irradiating the curing light on another remaining part of the photopolymerizable resin by reflecting the curing light on the reflecting member.

According to another aspect, the invention provides a light source device, including: a semiconductor laser; a coupling lens; a holder; and a photopolymerizable resin. The coupling lens converts laser light from the semiconductor laser to a light flux. The holder holds the semiconductor laser and the coupling lens. The holder includes a laser holding wall that holds the semiconductor laser, a lens holding part that holds the coupling lens, and a connection part that connects the laser holding wall and the lens holding part. The photopolymerizable resin fixes the coupling lens on the holder, the connection part being positioned distant away from an optical path of laser light emitted from the semiconductor laser toward the coupling lens farther than a position where the coupling lens is bonded with the lens holding part.

According to another aspect, the invention provides a light source device, including: a semiconductor laser; a coupling lens; a holder; and a photopolymerizable resin. The coupling lens that converts laser light from the semiconductor laser to a light flux. The holder holds the semiconductor laser and the coupling lens, the holder including a laser holding wall that holds the semiconductor laser, a lens holding part that holds the coupling lens, and a connection part that connects the laser holding wall and the lens holding part. The photopolymerizable resin fixes the coupling lens on the holder, the connection part having, in at least a part thereof, a reflecting surface that reflects light for curing the photopolymerizable resin.

According to another aspect, the invention provides a light source device, including: a semiconductor laser; a coupling lens, a holder; a photopolymerizable resin; and a reflecting member. The coupling lens converts laser light from the semiconductor laser to a light flux. The holder holds the semiconductor laser and the coupling lens. The photopolymerizable resin fixes the coupling lens on the holder. The reflecting member has an aperture through which the laser light emitted from the semiconductor laser passes toward the coupling lens, the reflecting member reflecting off a curing light for curing the photopolymerizable resin, the reflecting member being located between the semiconductor laser and the coupling lens.

According to another aspect, the invention provides a light source device, including: a semiconductor laser; a coupling lens; a holder; and a photopolymerizable resin. The coupling lens converts laser light from the semiconductor laser to a light flux. The holder holds the semiconductor laser and the coupling lens, the holder having a laser holding wall that holds the semiconductor laser. The photopolymerizable resin fixes the coupling lens on the holder, the laser holding wall having a reflecting surface that tilts toward an optical axis of the laser beam emitted from the semiconductor laser and that reflects off a curing light for curing the photopolymerizable resin.

BRIEF DESCRIPTION OF THE DRAWINGS

The particular features and advantages of the invention as well as other objects will become apparent from the following description taken in connection with the accompanying drawings, in which.

DETAILED DESCRIPTION

Figure 1:
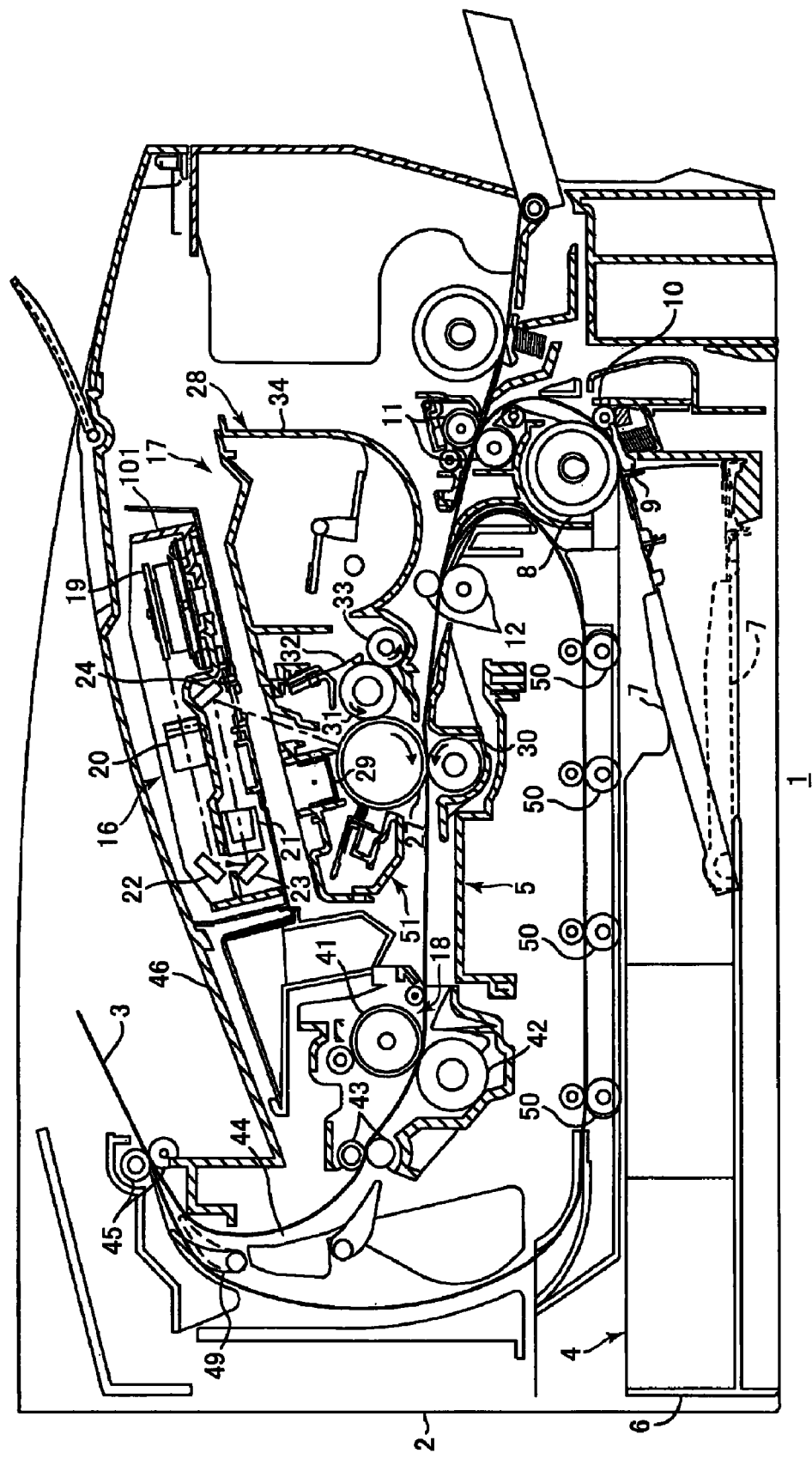
FIG. 1 is a cross-sectional side view of a laser printer according to an embodiment of the present invention.

A light source device, an exposure device and an image forming device according to an embodiment of the invention will be described while referring to the accompanying drawings wherein like parts and components are designated by the same reference numerals to avoid duplicating description.

Figure 2:
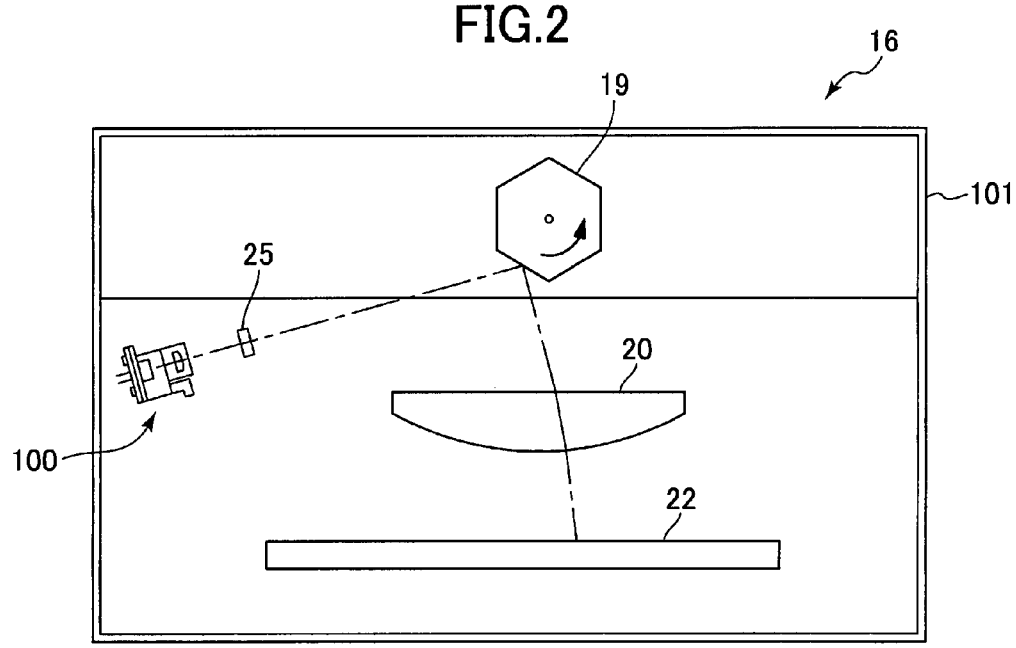
FIG. 2 is a plan view of a scanner unit provided in the laser printer of FIG. 1.

FIG. 1 is a cross-sectional side view of a laser printer 1 according to the embodiment. FIG. 2 is a plan view of a scanner unit 16 provided in the laser printer 1.

The laser printer 1 includes a main casing 2. The laser printer 1 further includes: a feeder section 4 and an image forming section 5. The feeder section 4 and the image forming section 5 are housed in the main casing 2. The feeder section 4 supplies sheets 3 (recording medium) one sheet at a time to the image forming section 5. The image forming section 5 forms a desired image on the supplied sheet 3 based on print data.

The feeder section 4 includes; a paper supply tray 6, a paper pressing plate 7, a sheet supply roller 8, a separating pad 9, paper dust removing rollers 10 and 11, and registration rollers 12. The paper supply tray 6 is detachably mounted in the bottom section of the main casing 2. The paper pressing plate 7 is disposed inside the paper supply tray 6.

In the feeder section 4, a stack of sheets 3 mounted in the paper supply tray 6 are pressed against the sheet supply roller 8 by the paper pressing plate 7. One sheet at a time is separated from the sheet stack by the sheet supply roller 8 and the separating pad 9, and passes the various rollers 10-12, before being conveyed to the image forming section 5.

The image forming section 5 includes: the scanner unit 16, a process cartridge 17, and a fixing section 18.

The scanner unit 16 is provided in an upper part of the main body casing 2. As shown in FIG. 2, the scanner unit 16 includes a light source device 100, a cylindrical lens 25, a polygon mirror 19, an fθ lens 20, and a reflecting mirror 22. The light source device 100 is for emitting laser light modulated according to print data. The cylindrical lens 25 focuses or gathers laser light emitted from the light source device 100 in a sub-scanning direction, while guiding the laser light to fall incident on the polygon mirror 19, thereby correcting an optical face tangle error of the polygon mirror 19. The polygon mirror 19 has a mirror formed on each side of a hexagon. While rotating, the polygon mirror 19 reflects the laser light which has passed through the cylindrical lens 25. Thereby, the mirror 19 deflects and scans the laser light in a main scanning direction. The fθ lens 20 converts the laser light which has been made to scan at an equal angular velocity by the polygon mirror 19 so that the laser light scans at a uniform velocity, while imaging the laser light on a surface of a photosensitive drum 27 to be described later.

In addition, the scanner unit 16 includes a correction lens 21, reflecting mirrors 23 and 24, as shown in FIG. 1, that serve to direct the laser light, which has been directed toward a lower direction by the reflecting mirror 22, to the photosensitive drum 27.

Each of the members described above is appropriately mounted in a case 101.

The configuration of the light source device 100 will be described more in detail later.

The process cartridge 17 is disposed below the scanner unit 16 in the main casing 2, and can be detached from the main casing 2. The process cartridge 17 includes a casing 51, in which the process cartridge 17 has a development cartridge 28, the photosensitive drum 27, a scorotron charge unit 29, and a transfer roller 30.

The development cartridge 28 is detachable from the casing 51, and is provided with a developing roller 31, a layer thickness regulating blade 32, a supply roller 33, and a toner box 34.

The toner box 34 is filled with toner with a positively charging nature. Rotation of the supply roller 33 supplies the developing roller 31 with toner from the toner box 34. At this time, the toner is triboelectrically charged to a positive charge between the supply roller 33 and the developing roller 31. Then, as the developing roller 31 rotates, the toner supplied onto the developing roller 31 moves between the developing roller 31 and the layer thickness regulating blade 32. This further triboelectrically charges the toner, and reduces thickness of the toner on the surface of the developing roller 31 down to a thin layer of uniform thickness.

The photosensitive drum 27 is disposed in confrontation with the developing roller 31. The photosensitive drum 27 is supported rotatably in the casing 51. The photosensitive drum 27 includes a drum-shaped member and a surface layer. The drum-shaped member is electrically grounded. The surface layer is formed from a photosensitive layer that is made from polycarbonate and that has a positively charging nature.

The scorotoron charge unit 29 is disposed above the photosensitive drum 27 and is spaced away from the photosensitive drum 27 by a predetermined space so as to avoid direct contact with the photosensitive drum 27. The scorotron charge unit 29 is a positive-charge scorotron type charge unit for generating a corona discharge from a charge wire made from, for example, tungsten. The scorotoron charge unit 29 forms a blanket of positive-polarity charge on the surface of the photosensitive drum 27.

The transfer roller 30 is rotatably supported at a position below and in confrontation with the photosensitive drum 27. The transfer roller 30 is rotatably supported in the casing 51. The transfer roller 30 includes a metal roller shaft and a roller portion covering the roller shaft. The roller portion is made from conductive rubber material. In order to perform a transfer operation, the transfer roller 30 is applied with a transfer bias according to a constant current control.

As the photosensitive drum 27 rotates, the scorotoron charge unit 29 first forms a blanket of positive charge on the surface of the photosensitive drum 27, and then the surface of the photosensitive drum 27 is exposed to high speed scan of the laser beam from the scanner unit 16. The electric potential of the positively charged surface of the photosensitive drum 27 drops at positions exposed to the laser beam. As a result, an electrostatic latent image is formed on the photosensitive drum 27 based on print data.

Next, an inverse developing process is performed. That is, as the developing roller 31 rotates, the positively-charged toner borne on the surface of the developing roller 31 is brought into contact with the photosensitive drum 27. Because a developing bias voltage is applied to the developing roller 31, the toner on the developing roller 31 is supplied to lower-potential areas of the electrostatic latent image on the photosensitive drum 27. As a result, the toner is selectively borne on the photosensitive drum 27 so that the electrostatic latent image is developed into a visible toner image.

The visible toner image borne on the surface of the photosensitive drum 27 confronts the transfer roller 30 and is transferred onto a sheet 3 as the sheet 3 passes between the photosensitive drum 27 and the transfer roller 30.

The fixing section 18 includes a heating roller 41, a pressure roller 42 applying pressure to the heating roller 41, and transport rollers 43. In the fixing section 18, the toner, which has been transferred to the sheet 3 by the process cartridge 17, is thermally transferred onto the sheet 3 while the sheet 3 passes through between the heating roller 41 and the pressure roller 42. Thereafter, the sheet 3 is transferred to a sheet discharging path 44 by the transport rollers 43. The sheet 3 transported to the sheet discharging path 44 is conveyed to discharge rollers 45. When the discharge rollers 45 rotate forwardly, the discharge rollers 45 discharge the sheet 3 onto a discharge tray 46. When the discharge rollers 45 rotate in reverse and a flapper 49 is swung from the orientation shown in solid line to the orientation shown in broken line in FIG. 3, the sheet 3 is fed back to the inside of the main casing 2 and is fed back to the upstream side of the image forming section 5 by a plurality of inversion transport rollers 50. At this time, the upper and lower surfaces of the sheet 3 are reversed from the first time that an image has been formed on the sheet 3 so that an image can be formed on the other side as well. In this way, images are formed on both sides of the sheet 3

Figure 3:
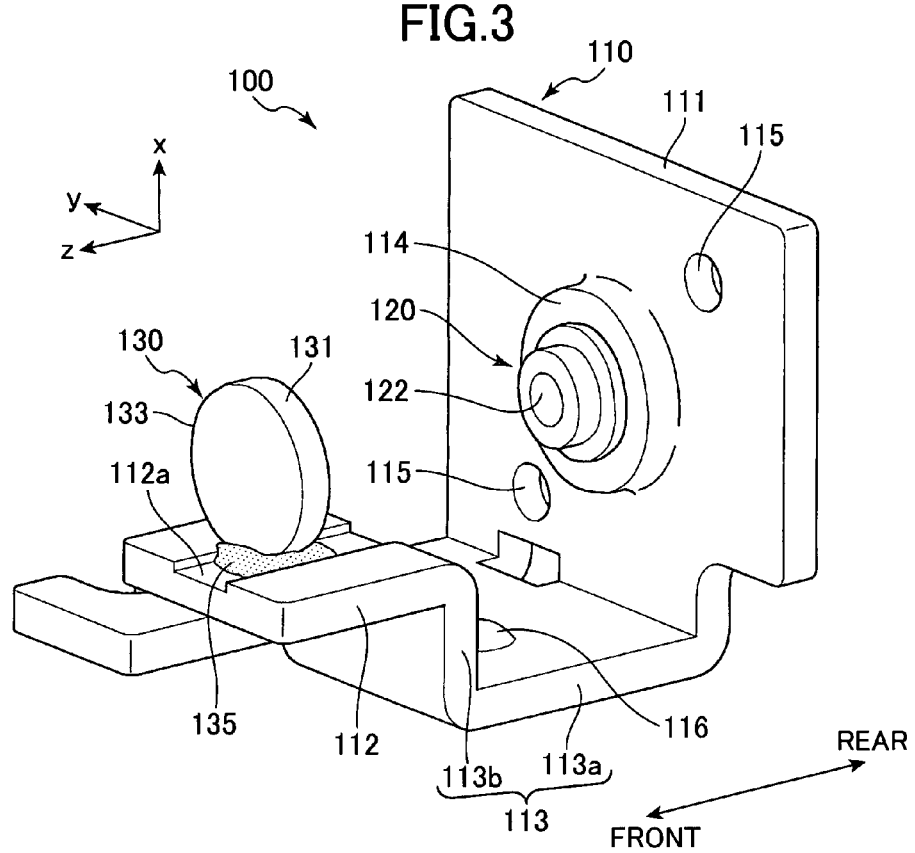
FIG. 3 is a perspective view of a light source device provided in the scanner unit of FIG. 2.
Figure 4:
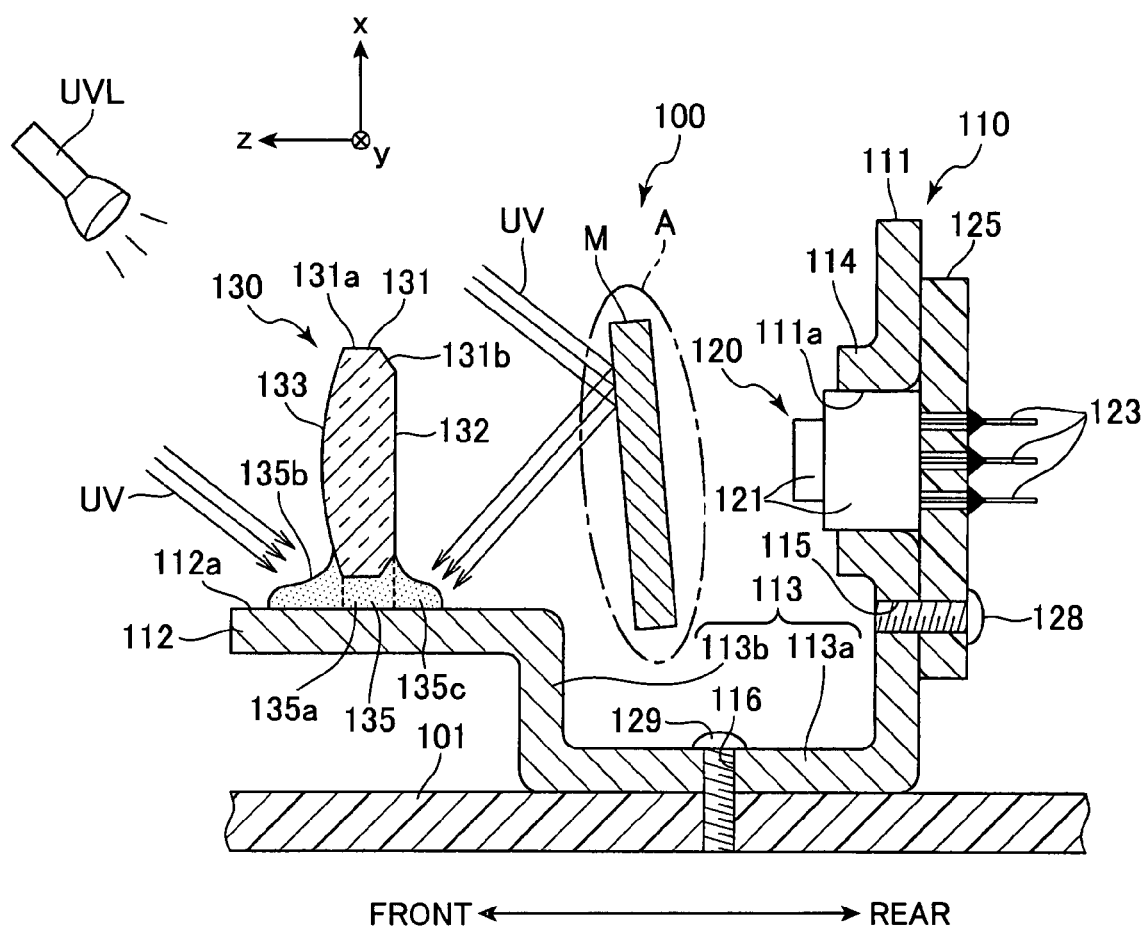
FIG. 4 is a cross-sectional view that illustrates a manufacturing method of the light source device of FIG. 3.

FIG. 3 is a perspective view of the light source device 100. FIG. 4 is a cross-sectional view that illustrates a manufacturing method of the light source device 100.

As shown in FIG. 3, the light source device 100 includes a holder 110. A semiconductor laser 120 and a coupling lens 130 are fixed on the holder 110. The semiconductor laser 120 is for emitting light that is modulated according to the print data.

The holder 110 is obtained by carrying out a sheet-metal processing on a plate material made of aluminum alloy or aluminum.

The holder 110 includes a laser holding wall 111, a lens holding part 112, and a connecting part 113. The semiconductor laser 120 is fixed on the laser holding wall 111. The lens holding part 112 is of a base shape, and the coupling lens 130 is fixed on the base-shaped lens holding part 112. The connecting part 113 connects the laser holding wall 111 and the lens holding part 112 with each other.

The laser holding wall 111 has a mounting through-hole 111a having a circular shape. The mounting through-hole 111a is formed on the center of the laser holding wall 111. The mounting through-hole 111a is formed by penetrating the laser holding wall 111 so that the semiconductor laser 120 can fit therein (refer to FIG. 4). An edging 114 projecting toward a front side (direction in which the laser light of the semiconductor laser 120 is emitted) is formed on an edge of the mounting through-hole 111a. The edging 114 forms a tube part, in which the semiconductor laser 120 fits. In addition, the laser holding wall 111 has two screw through-holes 115 provided thereon. The screw through-holes 115 are used for fixing the semiconductor laser 120 (refer to FIG. 3) on the laser holding wall 111.

The lens holding part 112 is located distant from the laser holding wall 111 for a predetermined distance in a front direction. A groove 112a extending in a front-back direction is formed on a top surface of the lens holding part 112, that is, a surface on which the coupling lens 130 is mounted. Photopolymerizable or light-curing resin 135 that serves as adhesive for fixing the coupling lens 130 on the lens holding part 112 is provided in the groove 112a. That is, by applying the photopolymerizable resin 135 in the groove 112a in a manner that the resin 135 stays in the groove 112a, the resin is prevented from flowing away from the lens 130 in a direction perpendicular to the front-back direction. The groove 112a can also serve as a reference position, on which the photopolymerizable resin 135 is to be applied.

The holder 110 is preferably made of metal. For example, the holder 110 is made of aluminum or aluminum alloy. In this manner, a top surface of the lens holding part 112 is capable of reflecting light for curing the photopolymerizable resin 135. By reflecting light on the surface of the lens holding part 112, the curing of the photopolymerizable resin 135 can be accelerated. The holder 110 may be made of other material that can reflect off light.

The connection part 113 includes a bottom wall part 113a and a front wall part 113b. The bottom wall part 113a extends in a front direction from a bottom edge of the laser holding wall 111. The front wall part 113b extends vertically so as to connect a front edge of the bottom wall part 113a and a rear edge of the lens holding part 112.

In this way, the connection part 113 is formed in a bent shape that is bent downwardly from the lens holding part 112. So, the connection part 113 is distant from an optical path of the laser light emitted from the semiconductor laser 120 to the coupling lens 130 farther than a position where the coupling lens 130 is bonded with the lens holding part 112. So, as shown in FIG. 4, a reflector inserting space A is formed between the semiconductor laser 120 and the coupling lens 130. A reflector such as a mirror M described later is located in the reflector inserting space A.

The bottom wall part 113a has a screw through-hole 116 formed thereon. The screw through-hole 116 is used for fixing the holder 110 on the case 101 of the scanner unit 16.

The semiconductor laser 120 is a known device including a package 121 as an outer packaging and an aperture 122 formed on the package 121. A light emitting element (not shown) is provided in the inside of the package 121. The laser light is emitted from the semiconductor laser 120 through the aperture 122. As shown in FIG. 4, the semiconductor laser 120 is pressed and fixed in the mounting through-hole 111a. The semiconductor laser 120 has terminals 123. The terminals 123 pass through through-holes formed in a printed circuit board 125 and are connected to a circuit (not shown). The print circuit board 125 is fixed to the laser holding wall 111 by fastening screws 128 in the screw through-holes 115.

The coupling lens 130 is for gathering the laser light emitted from the semiconductor laser 120 and converts the laser light to a light flux (bundle of light). The coupling lens 130 is located distant from the semiconductor laser 120 by a distance that is determined dependently on a focal length of the lens 130. The coupling lens 130 is bonded with and fixed on the lens holding part 112 by the photopolymerizable resin 135.

The photopolymerizable resin 135 is provided between the coupling lens 130 and the lens holding part 112 of the holder 110, and partly protrudes both to a front side and a rear side of the coupling lens 130. So, the coupling lens 130 can be firmly fixed even in a case where the coupling lens 130 is thin. This is because the photopolymerizable resin 135 holds the coupling lens 130 against any forces applied in the forward direction and applied in the rearward direction.

In other words, the photopolymerizable resin 135 is provided on the lens holding part 112 so that the photopolymerizable resin 135 has: a main part 135a that is located between the coupling lens 130 and the lens holding part 112; a front protruding part 135b that protrudes forwardly from the main part 135a; and a rear protruding part 135c that protrudes rearwardly from the main part 135a.

More specifically, the coupling lens 130 has a pair of optical surfaces 132 and 133 and an outer peripheral surface 131. The pair of optical surfaces 132 and 133 includes: the rear surface 132 and a front surface 133. The laser light from the semiconductor laser 120 passes through the pair of optical surfaces 132 and 133. The outer peripheral surface 131 connects the pair of optical surfaces 132 and 133. In this example, the outer peripheral surface 131 has: a main part 131a that extends parallel to the optical axis of the coupling lens 130 and an additional part 131b that extends from the main part 131a toward the rear surface 132 obliquely rearwardly with respect to the optical axis of the coupling lens 130. The rear surface 132 is flat and is perpendicular to the optical axis of the coupling lens 130, while the front surface 133 is curved around the optical axis of the coupling lens 130.

In the photopolymerizable resin 135, the main part 135a is located between the outer peripheral surface 131 of the coupling lens 130 and the lens holding part 112, the front protruding part 135b protrudes forwardly from the main part 135a, and the rear protruding part 135c protrudes rearwardly from the main part 135a.

It is noted that in this example, the front protruding part 135b protrudes from the main part 135a not only forwardly but also upwardly along the front surface 133. So, the front protruding part 135b is in contact with a lower part of the front surface 133. Contrarily, the rear protruding part 135c protrudes from the main part 135a only rearwardly. So, the rear protruding part 135c is out of contact with the rear surface 132. However, the rear protruding part 135c may protrude from the main part 135a not only rearwardly but also upwardly along the rear surface 132. In this case, the rear protruding part 135c will become in contact with a lower part of the rear surface 132. So, the coupling lens 130 can be more firmly fixed even in a case where the coupling lens 130 is thin because the photopolymerizable resin 135 holds the lens 130 between its front and rear surfaces and the lens holding part 112.

As apparent from FIG. 4, the coupling lens 130 is fixed at a position away from the lens holding part 112 in the vertical direction (x direction). In this manner, the coupling lens 130 can be fixed on the holder 110 after the position of the lens 130 is adjusted relative to the semiconductor laser 120.

The coupling lens 130 can be made of glass or resin. A material having a thermal expansion coefficient, which is in a range of $(1/2) \times C$ to $C$, wherein C is the thermal expansion coefficient of a member constituting the holder 110 is preferably selected. By selecting a material having the thermal expansion coefficient close to that of the holder 110 as described above, a change in an optical characteristic of the light source device 100 can be made small even when there is a temperature change.

In addition, the outer peripheral surface 131 of the coupling lens 130 is roughened. So, when the coupling lens 130 is made of glass, the outer peripheral surface 131 is in a ground glass form. When the coupling lens 130 is made of resin, the outer peripheral surface 131 is in a ground resin form. Since the outer peripheral surface 131 is roughened, curing light (ultraviolet ray in the present embodiment) entering inside the coupling lens 130 diffuses adequately on the outer peripheral surface 131. In this manner, the ultraviolet ray falls on the photopolymerizable resin 135 evenly below the coupling lens 130 (between the coupling lens 130 and the holder 110).

The holder 110 is fixed on the case 101 in a manner that a screw 129 is put into the screw through-hole 116 and screwed in the case 101.

With the above-described structure, the connection part 113 is positioned distant from the optical path of the laser light emitted from the semiconductor laser 120 farther than the position where the coupling lens 130 is bonded with the lens holding part 112. Also, there is formed the reflector inserting space A. The reflector such as the mirror M is located in the reflector inserting space A. The curing light irradiated from the front side of the coupling lens 130 reflects off the mirror M. In this manner, the irradiated light can strike on the photopolymerizable resin 135 from both of the front and rear sides of the coupling lens 130. For this reason, the entire part of the photopolymerizable resin 135, including the parts protruding in the front and rear sides of the coupling lens 130 is entirely cured at a time, thereby the coupling lens 130 can be firmly fixed. That is, accuracy of the light source device 100 can be improved despite the simple configuration.

In addition, the scanner unit 16 and the laser printer 1 including the light source device 100 can be configured easily and with high accuracy.

In addition, the photopolymerizable resin 135 is cured between the front side and the rear side of the coupling lens 130 and the holder 110 (lens holding part 112), thereby the coupling lens 130 can be fixed firmly on the holder 110 even in a case where the lens 130 is thin.

The light source device 100 can be configured at extremely low cost by configuring the holder 110 by carrying out the sheet metal processing on a metal plate. In particular, by adopting aluminum or aluminum alloy as the material of the holder 110, heat dissipation of the holder 110 becomes higher. Thereby, the holder 110 can be made to have a function also as a cooling plate of the semiconductor laser 120.

Next, a manufacturing method of the light source device 100 will be described.

First, the semiconductor laser 120 is pressed and fixed in the laser holding wall 111. Then, the print circuit board 125 is fixed on the laser holding wail 111 with the screws 128.

Then, the holder 110 is fixed on the case 101 of the scanner unit 16 with the screw 129.

Next, the photopolymerizable resin 135 is applied on the groove 112a of the lens holding part 112. The photopolymerizable resin 135 is applied to spread in a front-back direction across a position where the coupling lens 130 is assumed to be located. In this manner, the photopolymerizable resin 135 can protrude out in the front and rear sides of the coupling lens 130. More specifically, the photopolymerizable resin 135 is applied to spread in the front-back direction across a position where the outer peripheral surface 131 of the coupling lens 130 is assumed to be located. So, the photopolymerizable resin 135 is provided between the outer peripheral surface 131 of the coupling lens 130 and the lens holding part 112, and partly protrudes out to the front and rear sides of the coupling lens 130.

Next, the coupling lens 130 is held by a robot hand (not shown) having multiple spindles. The coupling lens 130 may be held by the robot hand in a manner that the outer peripheral surface 131 of the coupling lens 130 is held or nipped by the robot hand, or the outer peripheral surface 131 or a rim of the front or rear side surface (optical surface) 133, 132 of the coupling lens 130 is vacuum-absorbed by the robot hand. Then, the robot hand is operated to adjust orientation and a position in the x-y direction shown in FIG. 3 or FIG. 4 of the coupling lens 130. Further, in a similar manner, a position in the z direction shown in FIG. 3 or FIG. 4 of the coupling lens 130 is adjusted.

A goniometer can be used in place of the robot hand to hold the coupling lens 130 in order to adjust the position and the orientation of the coupling lens 130. In this case, the goniometer can be operated manually to adjust the position and the orientation of the coupling lens 130.

Then, when the position of the coupling lens 130 is fixed, the mirror M is positioned between the coupling lens 130 and the semiconductor laser 120. The mirror M only needs to be able to reflect the curing light. Therefore, the mirror M is not limited to a generally-used type of mirror which is manufactured by silver-plating a glass plate. For example, the mirror M can be a metal plate, a half-silvered mirror, a dichroic mirror, or the like. In addition, a shape of the mirror M is not limited to have a plane surface, but may have a curved surface.

Next, an ultraviolet ray lamp UVL is provided in front of the coupling lens 130. An ultraviolet ray UV is irradiated from the front side of the photopolymerizable resin 135. In this manner, the photopolymerizable resin 135 is cured. The ultraviolet ray UV directly strikes on the photopolymerizable resin 135 from the front side of the coupling lens 130. Also, the ultraviolet ray UV reflects off the mirror M and strikes on the photopolymerizable resin 135 from the rear side of the coupling lens 130. For this reason, the photopolymerizable resin 135 is entirely cured at a time.

The ultraviolet ray UV is preferably irradiated from the front side of the coupling lens 130. Still preferably, the ultraviolet ray UV is appropriately irradiated obliquely from an upper front side of the coupling lens 130 so that the ultraviolet ray UV strikes on the photopolymerizable resin 135 entirely.

After the photopolymerizable resin 135 is cured, the irradiation of the ultraviolet ray UV is stopped and the mirror M is removed from between the coupling lens 130 and the semiconductor laser 120. In this manner, the operation in relation to the fixing of the coupling lens 130 is finished.

By the operation described above, the coupling lens 130 can be fixed on the holder 110 at an ideal position with respect to the semiconductor laser 120. In addition, as described above, the ultraviolet ray UV which has entered inside the coupling lens 130 is diffused on the outer peripheral surface 131. So, the ultraviolet ray UV strikes on the photopolymerizable resin 135 between the coupling lens 130 and the holder 110 evenly. In this manner, an uncured part can be eliminated.

Further, the ultraviolet ray UV which has passed through the photopolymerizable resin 135 reflects off the surface of the holder 110, or more particularly, the lens holding part 112, and contributes to the curing of the photopolymerizable resin 135 again. Therefore, the photopolymerizable resin 135 can be prevented from being uncured.

Thus, the coupling lens 130 is firmly fixed on the holder 110. In addition, the photopolymerizable resin 135 is cured at a time. So, accuracy of positioning of the coupling lens 130 can be improved.

Irradiating the ultraviolet ray directly from the rear side of the coupling lens 130 is difficult due to existence of the laser holding wall 111. However, according to the manufacturing method of the present embodiment, the ultraviolet ray is reflected by the mirror M so as to be irradiated onto the rear side of the coupling lens 130, and the light source device 100 can be manufactured easily. By irradiating the ultraviolet ray directly on the front side of the coupling lens 130 and indirectly on the rear side of the coupling lens 130, the ultraviolet ray call be irradiated on the photopolymerizable resin 135 entirely without the coupling lens 130 blocking the light.

<First Modification>

Figure 5:
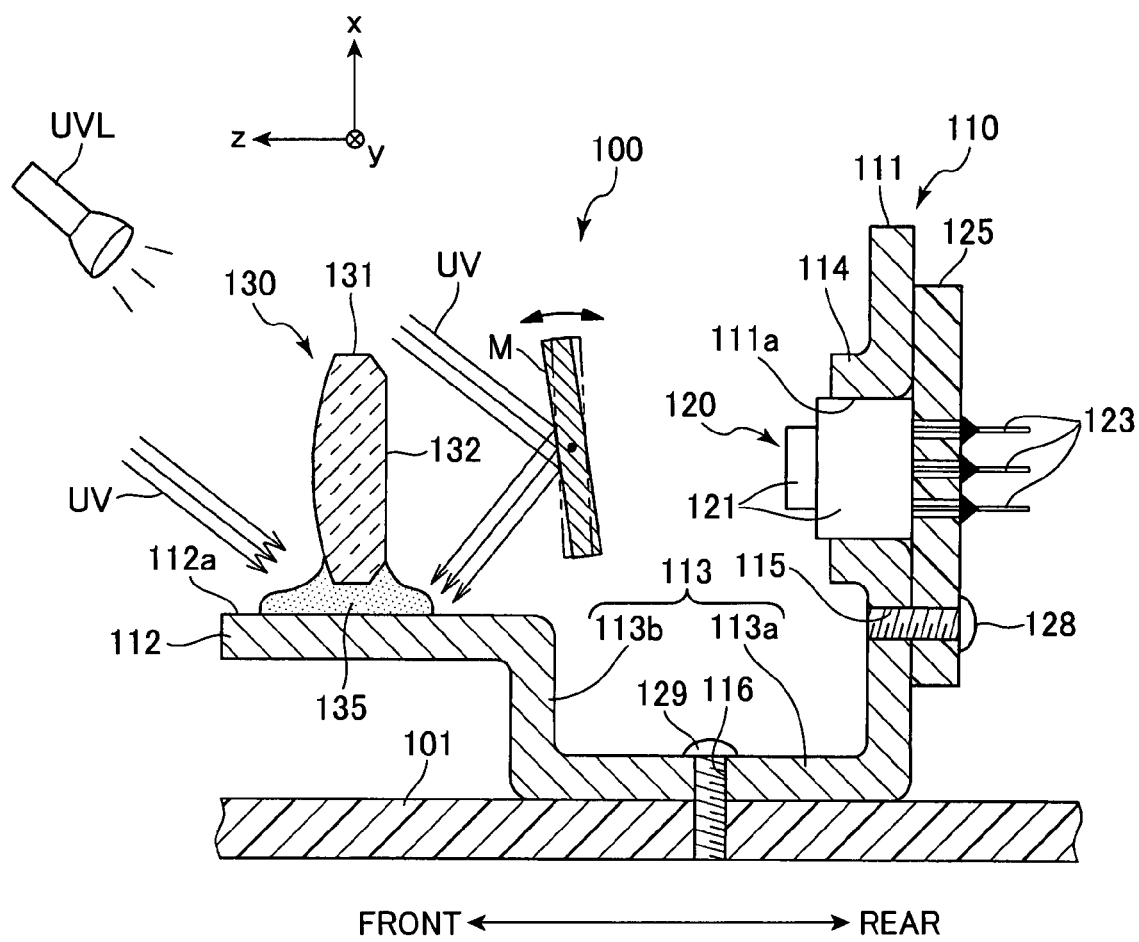
FIG. 5 is a view that illustrates a manufacturing method of a light source device according to a first modification.

FIG. 5 is a view that illustrates the manufacturing method of a light source device according to a first modification.

The first modification is the same as the above-described embodiment except for the points described below.

According to this modification, the mirror M is not kept static, but orientation of the mirror M is changed while the ultraviolet ray UV is irradiated. In this manner, the ultraviolet ray UV is irradiated in a wider range by the mirror M. Therefore, even if there is unevenness in an applying area of the photopolymerizable resin 135, the photopolymerizable resin 135 can surely be cured. In FIG. 5, the mirror M is rotated around the y axis and tilted to the front and rear directions. The mirror M may be rotated around the x axis and tilted to the left and right directions.

<Second Modification>

Figure 6:
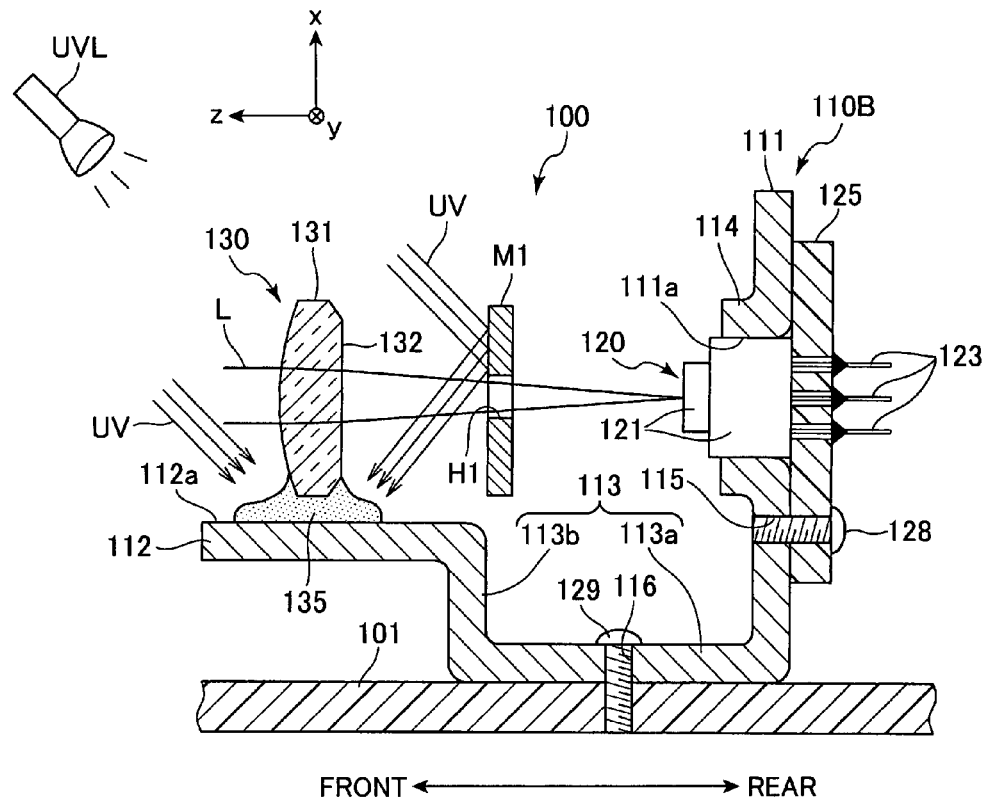
FIG. 6 is a view that illustrates a manufacturing method of a light source device according to a second modification.

FIG. 6 is a view that illustrates the manufacturing method of a light source device according to a second modification.

The second modification is the same as the above-described embodiment except for the points described below.

According to the second modification, a mirror M1, which is used for the curing of the photopolymerizable resin 135a instead of the mirror M, is formed with a through hole H1. The through hole H1 is for allowing laser light L to pass therethrough. Before the position of the coupling lens 130 is fixed, the mirror M1 is located so as to position the through hole H1 in an optical path of the laser light L, and the laser light L is irradiated from the semiconductor laser 120. Then, while at least one of tilt and a focus of the laser light L that has passed through the mirror M1 and the coupling lens 130 is checked, the orientation and the position in the x-y direction and the z direction of the coupling lens 130 are adjusted. After the position and the orientation of the coupling lens 130 are fixed, the ultraviolet ray UV is irradiated.

After the photopolymerizable resin 135 is cured, the irradiation of the ultraviolet ray UV is stopped and the mirror M1 is removed from between the coupling lens 130 and the semiconductor laser 120. In this manner, the operation in relation to the fixing of the coupling lens 130 is finished.

As described above, since the through hole H1 is provided on the mirror M1, the coupling lens 130 can be adjusted and fixed while the laser light L is irradiated. Therefore, the position of the coupling lens 130 can be adjusted with high accuracy.

It is sufficient that at least a part of the laser light L passes through the mirror M1. So, a half mirror or a transparent film may be located in the through hole H1. It is noted, however, that the coupling lens 130 is desirably adjusted in a state where the length of an optical path between the semiconductor laser 120 and the coupling lens 130 is same as that when the light source device 100 is used for image formation. Therefore, it is desirable to place no member in the through hole H1 so that the laser light L passes through the air in the through hole H1.

<Third Modification>

Figure 7:
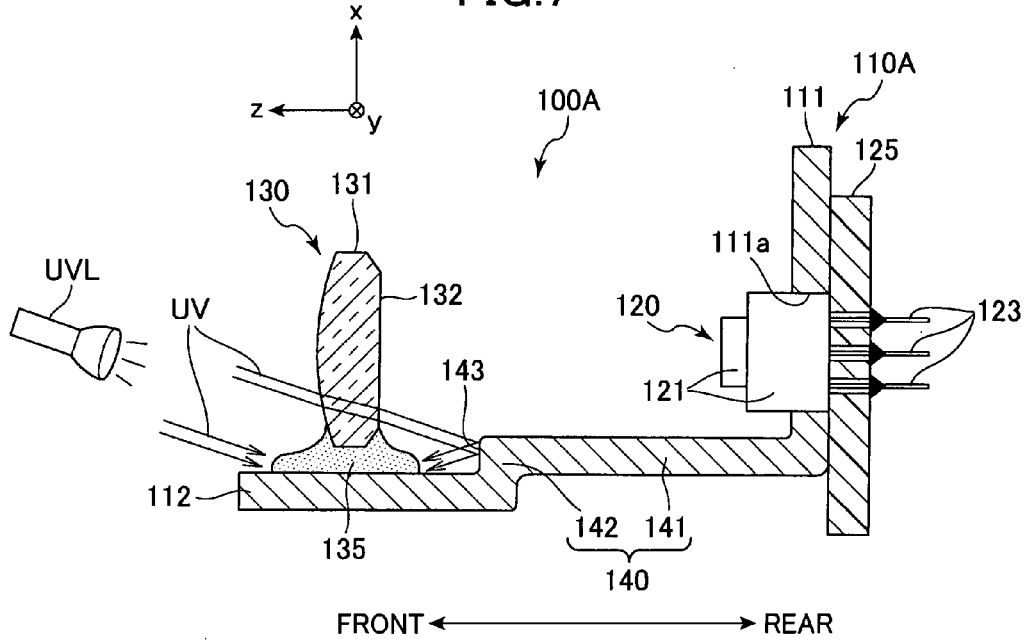
FIG. 7 is a view that illustrates a light source device according to a third modification.

FIG. 7 is a view that illustrates a light source device according to a third modification.

As shown in FIG. 7, a light source device 100A according to the third modification has a holder 110A. The holder 110A is the same as the holder 110 of the embodiment except that the holder 110A has a connection part 140 that connects the laser holding wall 111 and the lens holding part 112. The connection part 140 includes a bottom wall part 141 that extends in a front direction from a bottom edge of the laser holding wall 111, and a front wall part 142 that extends in a lower direction from a front edge of the bottom wall part 141 and is connected with a rear edge of the lens holding part 112.

That is, the holder 110A is in a form where the connection part 140 is closer to the optical path of the laser light than the position where the coupling lens 130 is bonded with the lens holding part 112.

In the holder 110A described above, the holder 110A is made of a material such as metal which is capable of reflecting the curing light. So, a front surface 143 of the front wall part 142 can function as a reflector. So, even though the ultraviolet ray lamp UVL is located in the front side of the coupling lens 130, the ultraviolet ray UV can be irradiated on the photopolymerizable resin 135 from the rear side of the coupling lens 130 by reflecting off the front surface 143 of the front wall part 142.

<Fourth Modification>

Figure 8A:
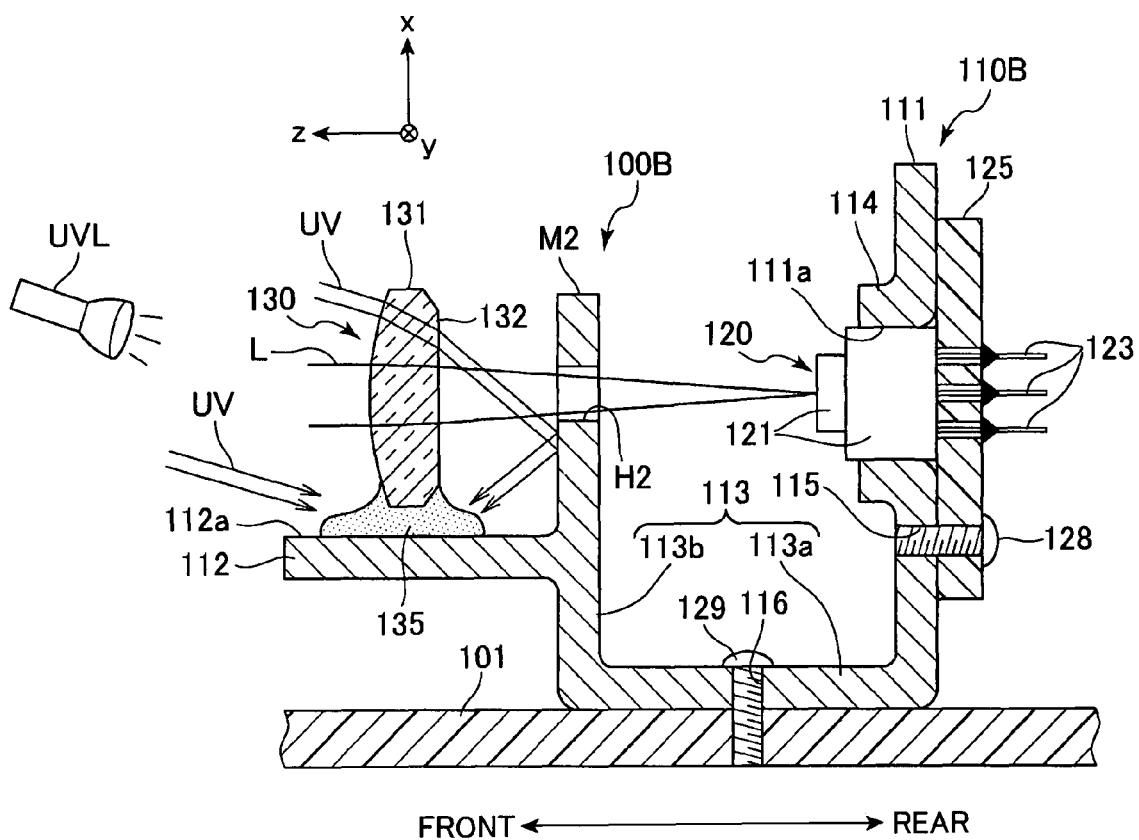
FIG. 8A is a view that illustrates a light source device according to a fourth modification.

FIG. 8A is a view that illustrates a light source device according to a fourth modification.

As shown in FIG. 8A, a light source device 100B according to the fourth modification is different from the light source device 100 according to the above-described embodiment in that a mirror M2 is formed by extending the front wall part 113b of the connection part 113 upward. The mirror M2 has a through hole H2 formed thereon at a location in correspondence with the light path of the laser light L.

That is, the light source device 100B is in a form where the mirror M2 is located between the semiconductor laser 120 and the coupling lens 130 and the mirror M2 is formed as a part of the holder 110.

Also in the light source device 100B described above, the holder 110B is made of a material such as metal which can reflect the curing light. So, the ultraviolet ray UV can be irradiated from the rear side of the coupling lens 130 by reflecting off the mirror M2.

In addition, the through hole H2 may be used as an aperture diaphragm for forming the laser light L into a desirable beam shape and size. It becomes unnecessary to mount an aperture diaphragm separately. In this manner, the light source device with high accuracy can be obtained without increasing the number of members mounted in the light source device.

Figure 8B:
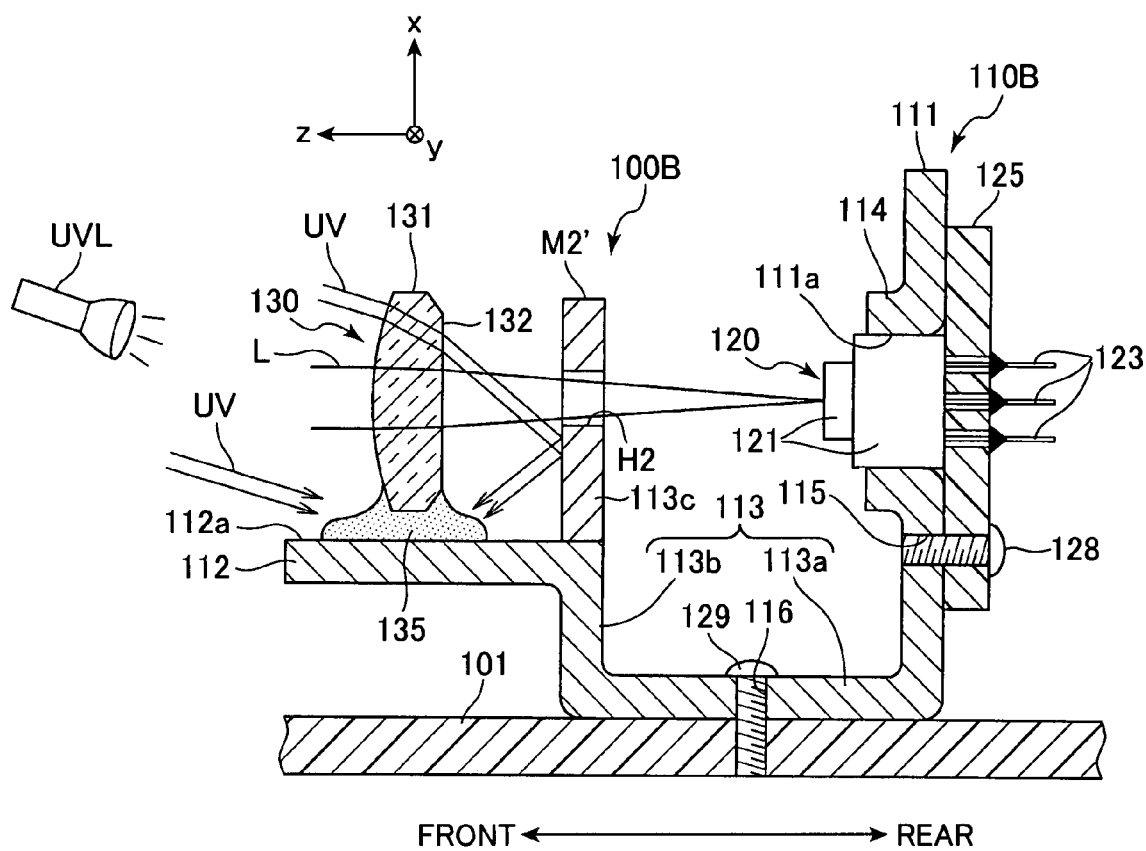
FIG. 8D is a view that illustrates a light source device according to a variation of the fourth modification.

In the above description, the mirror M2 is integrally formed with the holder 110B. However, as shown in FIG. 8B, a wall 113c that is a member separate from the holder 110B may be fixed on top of the front wall part 113b. By making the wall 113c of material such as metal that reflects off the curing light, the wall 113c serves as a mirror M2' that operates in the same manner as the mirror M2.

<Fifth Modification>

Figure 9:
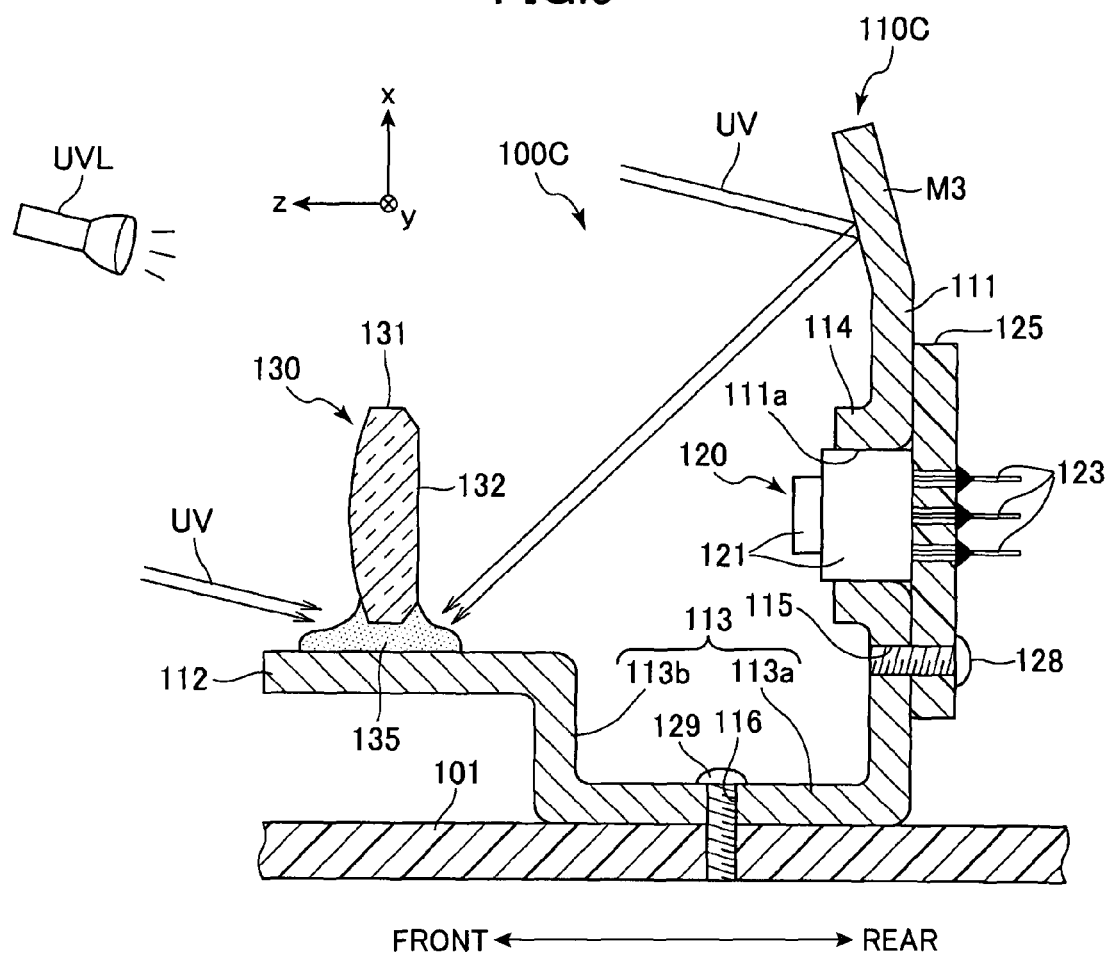
FIG. 9 is a view that illustrates a light source device according to a fifth modification.

FIG. 9 is a view that illustrates a light source device according to a fifth modification.

As shown in FIG. 9, a light source device 100C according to the fifth modification is different from the light source device 100 according to the above-described embodiment in that the light source device 100C has a holder 110C whose part functions as a reflector. More specifically, an upper part of the laser holding wall 111 tilts downward to the front to form a mirror M3. A part of the laser holding wall 111 tilts with respect to the optical axis of the semiconductor laser 120 so as to reflect off the ultraviolet ray UV toward the photopolymerizable resin 135. Therefore, when the ultraviolet ray UV is irradiated to cure the photopolymerizable resin 135, the mirror M3 reflects the ultraviolet ray UV. In this manner, the ultraviolet ray UV can be irradiated on the photopolymerizable resin 135 also from the rear side of the coupling lens 130.

In the fifth modification, the mirror M3 is formed in the holder 110C in an integrated manner in which the upper part of the laser holding wall 111 is bent in the front direction. However, a member which works as a mirror may be prepared separately from the holder 110C and mounted on the upper part of the laser holding wall 111.

<Sixth Modification>

Figure 10:
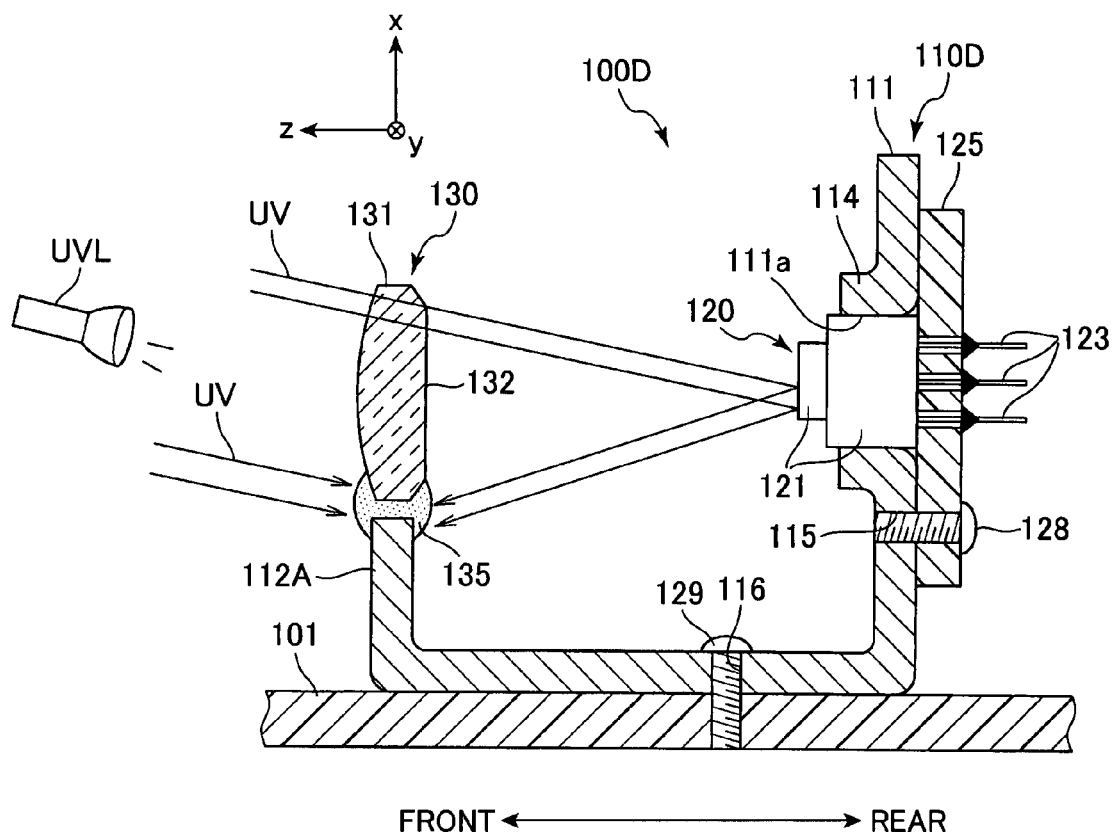
FIG. 10 is a view that illustrates a light source device according to a sixth modification.

FIG. 10 is a view that illustrates a light source device according to a sixth modification.

As shown in FIG. 10, a light source device 100D according to the sixth modification is different from the light source device 100 according to the above-described embodiment in that the light source device 100D has a holder 110D. The holder 110D has a lens holding part 112A which is not in a base shape, but is in a shape of a standing wall that faces the laser holding wall 111. The coupling lens 130 is placed on top of the lens holding part 112A, and is bonded and fixed by the photopolymerizable resin 135 to the top of the lens holding part 112A.

In addition, when the light source device 100D is manufactured, the package 121 of the semiconductor 120 can be used as the reflector. For example, as shown in FIG. 10, a front surface of the package 121 can be made as the reflector for reflecting off the ultraviolet ray UV toward the photopolymerizable resin 135.

As described above, because the package 121 is used as the reflector, the ultraviolet ray UV can be irradiated on the photopolymerizable resin 135 from the rear side of the coupling lens 130 in a manner that the package 121 reflects off the ultraviolet ray UV irradiated from the front side of the coupling lens 130.

While the invention has been described in detail with reference to the embodiment and modifications thereof, it would be apparent to those skilled in the art that various changes and modifications may be made therein without departing from the spirit of the invention.

For example, the laser printer 1 in the embodiment described above may be modified to other various types of image forming device, such as a copier and a multi-function machine.

The transfer roller 30 in the above embodiment may be modified into a non-contact type transfer roller.

In the above embodiment, the paper 3 such as a cardboard, a postcard, and a thin paper, is used as the recording sheet. However, the laser printer 1 may be modified to print on other various types of recording medium, such as an OHP sheet.

In the embodiment described above, the toner, the developing cartridge 28, the polygon mirror 19, the fθ lens 20, the scanner unit 16, and the photosensitive drum 27 are used as a developer, a developing unit, a deflector, a scanning lens, an exposure device, and a photosensitive body, respectively. However, the materials and the structure of the laser printer 1, such as the developing cartridge 28, the polygon mirror 19, the fθ lens 20, the scanner unit 16, and the photosensitive drum 27, can be appropriately modified.

What is claimed is:

1. A method of manufacturing a light source device that includes a semiconductor laser, a coupling lens that converts laser light from the semiconductor laser to a light flux and that has a first side and a second side opposite to the first side, a holder that holds the semiconductor laser and the coupling lens in a manner that the first side of the coupling lens confronts the semiconductor laser, and a photopolymerizable resin that fixes the coupling lens on the holder, the method comprising:

preparing a holder, on which a semiconductor laser and a coupling lens are provided, the coupling lens having a first side and a second side opposite to the first side, the first side confronting the semiconductor laser, a photopolymerizable resin being provided on the holder at least at a location between the coupling lens and the holder;

locating a light source for emitting a curing light for curing the photopolymerizable resin on an opposite side of the semiconductor laser with respect to the coupling lens, a reflecting member being provided on an opposite side of the light source with respect to the coupling lens; and curing the photopolymerizable resin by directly irradiating the curing light from the light source on a part of the photopolymerizable resin, and also irradiating the curing light on another remaining part of the photopolymerizable resin by reflecting the curing light on the reflecting member.

2. The method according to claim 1, wherein the coupling lens has an outer peripheral surface that connects the first side and the second side, the photopolymerizable resin is provided on the holder at least at a location between the outer peripheral surface of the coupling lens and the holder.

3. The method according to claim 2, wherein the photopolymerizable resin partly protrudes from between the outer peripheral surface of the coupling lens and the holder in both of a direction defined from the first side to the second side and a direction defined from the second side to the first side.

4. The method according to claim 1, wherein the reflecting member is provided between the semiconductor laser and the coupling lens.

5. The manufacturing method according to claim 1, wherein the holder has a wall defining a reflecting member inserting space on an opposite side of the light source with respect to the coupling lens, further comprising locating the reflecting member in the reflecting member inserting space, wherein the light source irradiates the curing light after the reflecting member is located in the reflecting member inserting space.

6. The method according to claim 1, wherein the reflecting member is configured so as to be able to allow laser light emitted from the semiconductor laser to pass therethrough, and further comprising, before irradiating the curing light from the light source, emitting the laser light from the semiconductor laser and checking at least one of tilt and focus of the laser light which has passed through the coupling lens, thereby positioning the coupling lens relative to the semiconductor laser based on the checked result.

7. The method according to claim 1, wherein the reflecting member is formed as part of the holder and is configured so as to be able to allow laser light emitted from the semiconductor laser to pass therethrough.

8. The method according to claim 1, wherein the reflecting member is fixed as a separate member on the holder and is configured so as to be able to allow laser light emitted from the semiconductor laser to pass therethrough.

9. The method according to claim 1, wherein the reflecting member is formed as part of the holder.

10. The method according to claim 1, wherein the light source irradiates the curing light while orientation of the reflecting member is changed.

11. The method according to claim 1, wherein a package of the semiconductor laser is used as the reflecting member.

12. The method according to claim 1, wherein the holder has a laser holding wall that holds the semiconductor laser, the holder being used as the reflecting member, at least a part of the laser holding wall tilting to an optical axis of the semiconductor laser so as to be able to reflect the curing light to irradiate the curing light on the photopolymerizable resin.

13. The method according to claim 1, further comprising locating a reflecting member on the opposite side of the light source with respect to the coupling lens, wherein the light source irradiates the curing light after the reflecting member is located on the opposite side of the light source with respect to the coupling lens.

14. The method according to claim 1, wherein the holder is prepared to have the reflecting member provided thereon, wherein the light source is located on an opposite side of the semiconductor laser and the reflecting member with respect to the coupling lens.

15. A light source device, comprising: a semiconductor laser;
   a coupling lens that converts laser light from the semiconductor laser to a light flux;
   a holder that holds the semiconductor laser and the coupling lens, the holder including a laser holding wall that holds the semiconductor laser, a lens holding part that holds the coupling lens, and a connection part that connects the laser holding wall and the lens holding part; and
   a photopolymerizable resin that fixes the coupling lens on the holder such that the distance between the connection part and an optical path of laser light emitted from the semiconductor laser toward the coupling lens is larger than the distance between a position where the coupling lens is bonded with the lens holding part and the optical path, wherein the coupling lens has a first side and a second side opposite to the first side, the first side confronting the semiconductor laser, the photopolymerizable resin has a main part that is located between the coupling lens and the holder, a first protruding part that protrudes from the main part in a direction defined from the second side to the first side, and a second protruding part that protrudes from the main part in a direction defined from the first side to the second side.

16. The light source device according to claim 15, wherein the coupling lens has an outer peripheral surface connecting the first side and the second side, the main part of the photopolymerizable resin is located between the outer peripheral surface of the coupling lens and the holder.

17. A light source device, comprising: a semiconductor laser;
   a coupling lens that converts laser light from the semiconductor laser to a light flux;
   a holder that holds the semiconductor laser and the coupling lens, the holder including a laser holding wall that holds the semiconductor laser, a lens holding part that holds the coupling lens, and a connection part that connects the laser holding wall and the lens holding part; and
   a photopolymerizable resin that fixes the coupling lens on the holder, the connection part having, in at least a part thereof, a reflecting surface that reflects light for curing the photopolymerizable resin, wherein the coupling lens has a first side and a second side opposite to the first side, the first side confronting the semiconductor laser, the photopolymerizable resin has a main part that is located between the coupling lens and the holder, a first protruding part that protrudes from the main part in a direction defined from the second side to the first side, and a second protruding part that protrudes from the main part in a direction defined from the first side to the second side.

18. The light source device according to claim 17, wherein the coupling lens has an outer peripheral surface connecting the first side and the second side, the main part of the photopolymerizable resin is located between the outer peripheral surface of the coupling lens and the holder.

19. A light source device, comprising: a semiconductor laser;
   a coupling lens that converts laser light from the semiconductor laser to a light flux;
   a holder that holds the semiconductor laser and the coupling lens;
   a photopolymerizable resin that fixes the coupling lens on the holder; and
   a reflecting member that has an aperture through which the laser light emitted from the semiconductor laser passes toward the coupling lens, the reflecting member reflecting off a curing light for curing the photopolymerizable resin, the reflecting member being located between the semiconductor laser and the coupling lens, wherein the coupling lens has a first side and a second side opposite to the first side, the first side confronting the semiconductor laser, the photopolymerizable resin has a main part that is located between the coupling lens and the holder, a first protruding part that protrudes from the main part in a direction defined from the second side to the first side, and a second protruding part that protrudes from the main part in a direction defined from the first side to the second side.

20. The light source device according to claim 19, wherein the coupling lens has an outer peripheral surface connecting the first side and the second side, the main part of the photopolymerizable resin is located between the outer peripheral surface of the coupling lens and the holder.

21. A light source device, comprising;
   a semiconductor laser;
   a coupling lens that converts laser light from the semiconductor laser to a light flux;
   a holder that holds the semiconductor laser and the coupling lens, the holder having a laser holding wall that holds the semiconductor laser; and
   a photopolymerizable resin that fixes the coupling lens on the holder, the laser holding wall having a reflecting surface that tilts toward an optical axis of the laser beam emitted from the semiconductor laser and that reflects off a curing light for curing the photopolymerizable resin, wherein the coupling lens has a first side and a second side opposite to the first side, the first side confronting the semiconductor laser, the photopolymerizable resin has a main part that is located between the coupling lens and the holder, a first protruding part that protrudes from the main part in a direction defined from the second side to the first side, and a second protruding part that protrudes from the main part in a direction defined from the first side to the second side.

22. The light source device according to claim 21, wherein the coupling lens has an outer peripheral surface connecting the first side and the second side, the main part of the photopolymerizable resin is located between the outer peripheral surface of the coupling lens and the holder.

* * * * *